(12) United States Patent
Kajiwara et al.

(10) Patent No.: US 6,930,549 B2
(45) Date of Patent: Aug. 16, 2005

(54) VARIABLE GAIN AMPLIFIER FOR USE IN COMMUNICATIONS

(75) Inventors: Hisayoshi Kajiwara, Kokubunji (JP); Kenji Toyota, Takasaki (JP); Kazuhiko Hikasa, Hamura (JP); Taizo Yamawaki, Tokyo (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/446,859

(22) Filed: May 29, 2003

(65) Prior Publication Data

US 2004/0061554 A1 Apr. 1, 2004

(30) Foreign Application Priority Data

Sep. 26, 2002 (JP) .................................... P2002-280452

(51) Int. Cl.$^7$ ................................................. H03F 3/45
(52) U.S. Cl. ...................................... 330/254; 330/133
(58) Field of Search ................................ 330/254, 133, 330/134; 455/241.1, 251.1

(56) References Cited

U.S. PATENT DOCUMENTS 6,127,890 A  * 10/2000 Shimomura et al. ......... 330/254
6,137,362 A  * 10/2000 Dufossez .................... 330/254
6,621,344 B2 *  9/2003 Ritchie ........................ 330/254

FOREIGN PATENT DOCUMENTS

JP          35608401 A  *  7/1981  ............ H03G/3/00

OTHER PUBLICATIONS

Taizo Yamawaki, Masaru Kokubo, Kiyoshi Irie, Hiroaki Matsui, Kazuaki Hori, Takefumi Endou, Hiroshi Hagisawa, Tomio Furuya, Yoshimi Shimizu, Makoto Katagishi and Julian Robert Hildersley, "A 2.7–V GSM RF Tranceiver IC", IEEE Journal of Solid–State Circuits, vol. 32, No. 12, Dec. 1997, pp. 2089–2096.

Peter B. Kenington, "High Linearity RF Amplifier Design", Artech House, Inc., 1979, pp. 160–165.

* cited by examiner

Primary Examiner—Henry Choe
(74) Attorney, Agent, or Firm—Reed Smith LLP; Stanley P. Fisher, Esq.; Juan Carlos A. Marquez, Esq.

(57) ABSTRACT

A variable gain amplifier of low amplitude distortion, and low noise, having a large variable range, is provided. A variable gain differential amplifier that controls a gain by use of bias current is used as each of unit amplifiers (VGAs) making up the variable gain amplifier. A large variable gain range is obtained by series-connecting a plurality of the variable gain differential amplifiers. An attenuator is installed on the input side of the unit amplifier (VGA) at least in the initial stage. By doing so, it becomes possible to prevent amplitude distortion from occurring to the respective VGAs. An attenuator utilizing voltage division by capacitors, generating no noise, is used for lowering noise. Further, the variable gain amplifier is provided with a fixed gain amplifier installed in the final stage as necessary in order to obtain a total gain as desired. With the use of the variable gain amplifier as a variable gain amplifier for output power control of a polar loop transmitter, an excellent function for output power control can be achieved without causing significant deterioration in distortion characteristic and noise characteristic thereof.

24 Claims, 11 Drawing Sheets

F I G. 3
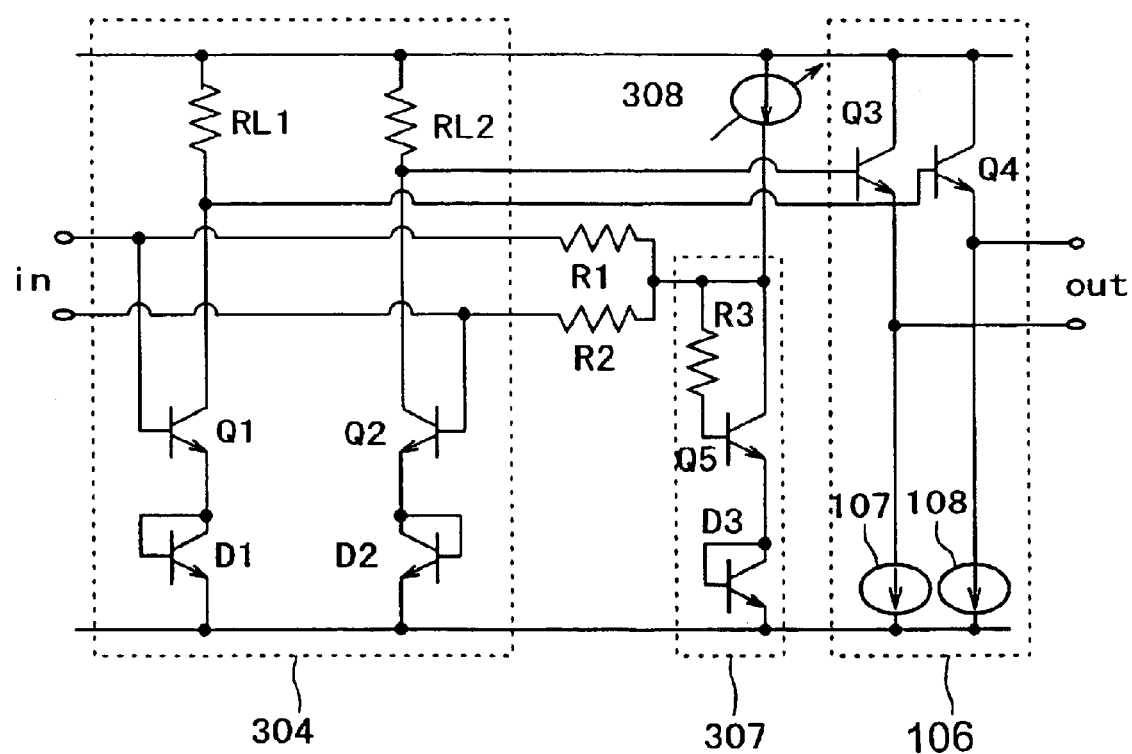

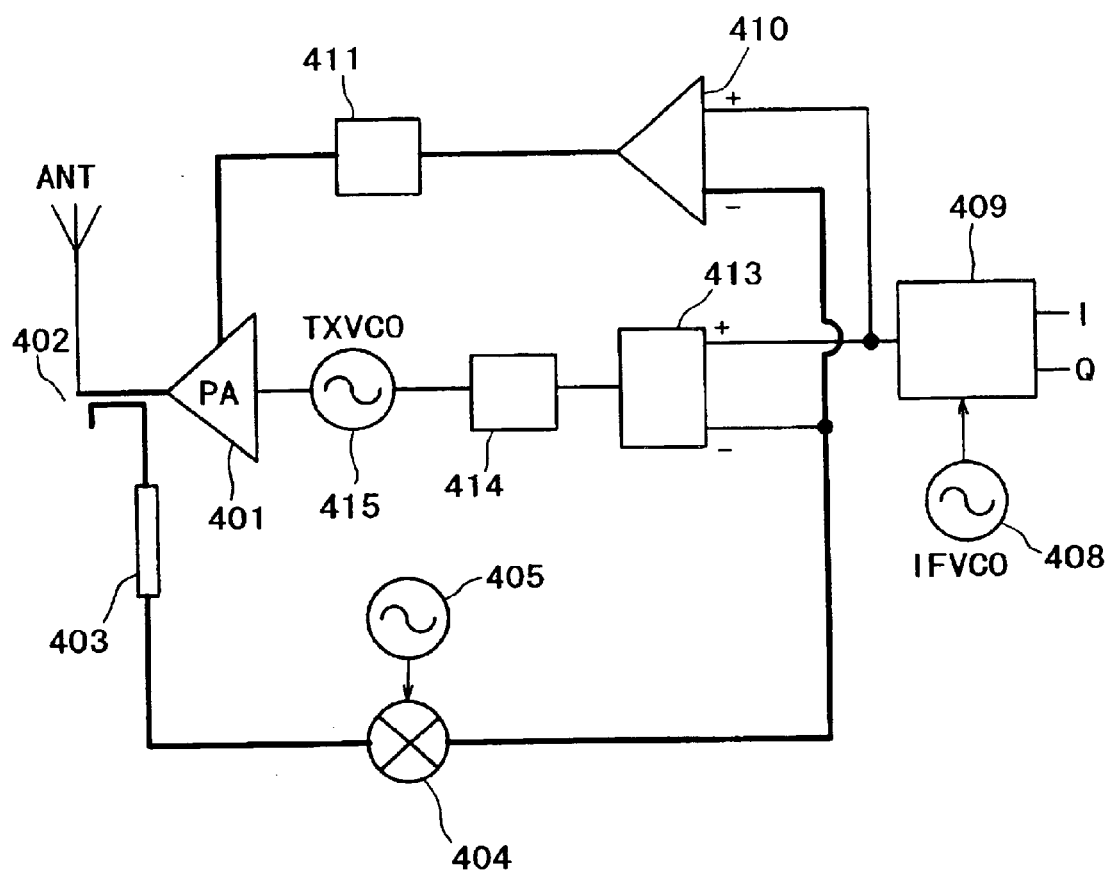
F I G. 4

F I G. 1 0
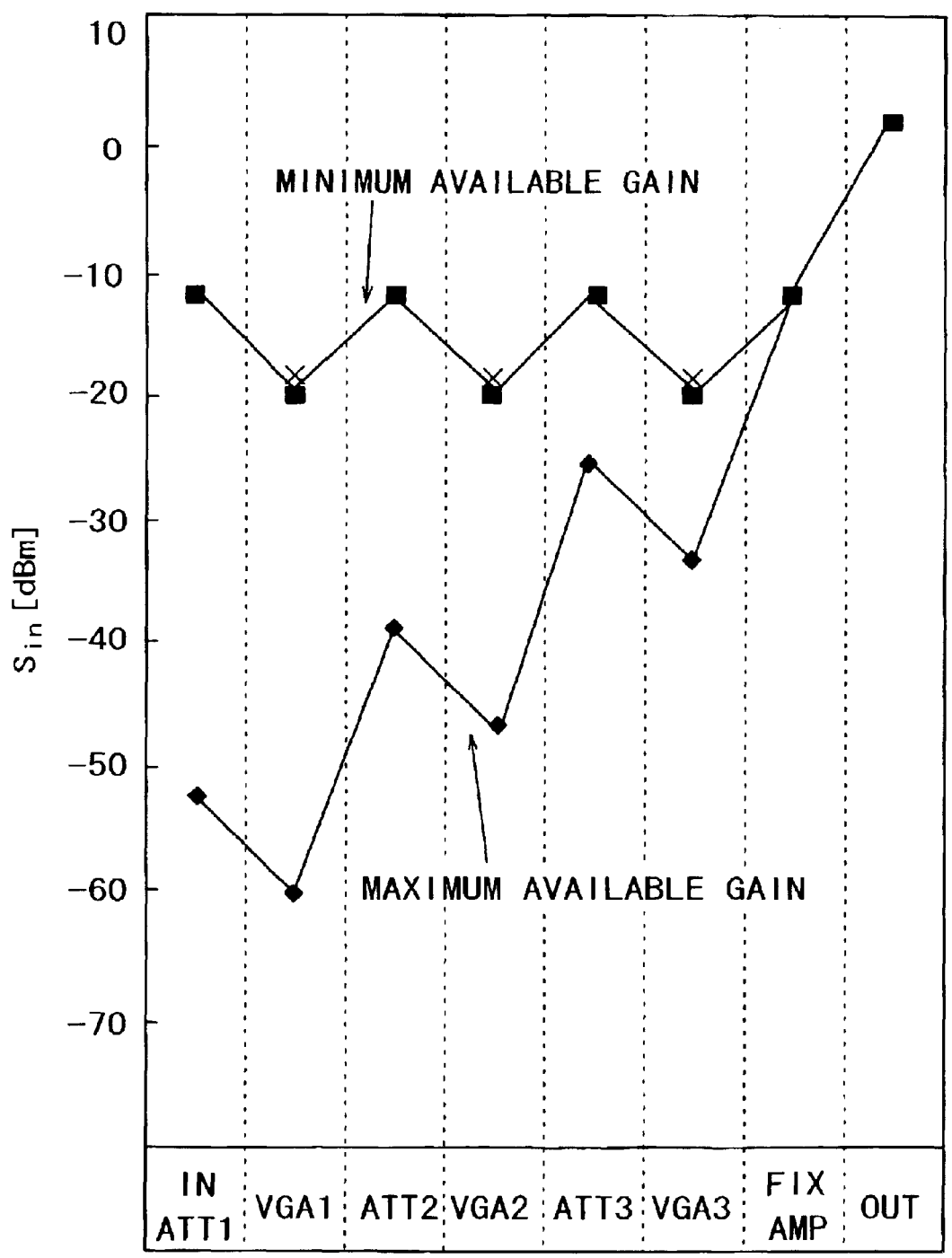

VARIABLE GAIN AMPLIFIER FOR USE IN COMMUNICATIONS

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The invention generally relates to a variable gain amplifier and, more particularly, to a variable gain amplifier suitable for use in a semiconductor integrated circuit for communications.

2. Discussion of Background

A conventional variable gain amplifier may employ a variable gain amplifier, shown in FIG. 2A and FIG. 2B, as a configuration block. For more detail see non-patent document 1 below. The variable gain amplifier controls a gain with bias current by taking advantage of the gain of a transistor being proportional to the bias current.

FIG. 2A and FIG. 2B show a conventional variable gain amplifier 200. FIG. 2A is a block circuit diagram of the variable gain amplifier 200 comprising variable gain unit amplifiers (hereinafter referred to merely as unit amplifiers) that are series connected in three stages, and FIG. 2B is a circuit diagram of the unit amplifier making up the respective stages.

Since there is a limitation to a variable gain range of the variable gain amplifier with a unit amplifier (VGA) 202 only in one stage as shown in FIG. 2A, the variable gain amplifier is generally configured such that the unit amplifiers in a plurality of stages (in the case of an example shown in FIG. 2A, 3 stages from VGA1 to VGA3) are connected in series so as to obtain a large variable gain range. The respective unit amplifiers 202 are made up of a variable gain differential amplifier 204 as shown in FIG. 2B, comprising differential pair transistors wherein respective emitters of transistors Q1, Q2 are connected with each other, and respective bases of the transistors Q1, Q2 serve as input terminals, and a variable current source 205 for supplying bias current to the differential pair transistors. Control of a gain of the variable gain differential amplifier 204 is implemented by controlling a current value of the variable current source 205.

In FIG. 2A, reference numeral C denotes a capacitor for cutting direct current (DC), IN an input signal to the variable gain amplifier 200, and OUT an output signal. Further, FIG. 2B IN denotes an input signal to the variable gain differential amplifier 204, OUT an output signal, Vcc a power source voltage for the variable gain differential amplifier, and Vbias a bias power source voltage for supplying bias current to the respective bases of the differential pair transistors Q1, Q2 via respective resistors R1, R2. Resistors RL1, RL2 are load resistors of the differential pair transistors Q1, Q2, respectively.

[Non-patent Document 1]

Yamawaki et al., "A 2.7-V GSM RF TRANCEIVER IC" in IEEE Journal of solid Sate Circuits, Vol. 32, No. 12, December, 1997

[Non-patent Document 2]

Kenington, Peter B., "High Linearity RF Amplifier Design", Artech House, Inc., 1979, pp. 161–163

With the conventional circuit shown in FIG. 2, there occurs amplitude distortion when a large signal is inputted thereto due to non-linearity of the respective variable gain differential amplifiers making up the variable gain amplifier, to which a good deal of thought has not been given. Accordingly, it has not been possible to obtain a variable gain amplifier capable of satisfying a requirement for low distortion-and low noise even at times of a large input signal.

SUMMARY OF THE INVENTION

It is an object of the invention to provide a variable gain amplifier having an excellent low noise characteristic without causing occurrence of amplitude distortion even when a large signal is inputted. It should be appreciated that the present invention can be implemented in numerous ways, including as a process, an apparatus, a system, a device or a method.

Further, it is another object of the invention to provide a polar loop transmitter using the variable gain amplifier having such an excellent low noise characteristic,.and having an excellent function for output power control, without causing significant deterioration in distortion characteristic and noise characteristic thereof.

The variable gain amplifier according to the invention is characterized in that a low noise attenuator is installed on the input side of a unit amplifier (VGA) at least in the initial stage. By installing the low noise attenuator on the input side of the VGA in the initial stage, an input signal to the VGA in the initial stage, significantly affected by noise, can be attenuated, so that it becomes possible to prevent amplitude distortion from occurring to the VGA in the initial stage. In this case, it is suitable for lowering noise to use an attenuator utilizing voltage division by capacitors that generates no noise as the low noise attenuator. Further, a fixed gain amplifier may be installed in the final stage as necessary in order to supplement insufficiency in total gain.

The invention encompasses other embodiments of a method, an apparatus, and a computer-readable medium, which are configured as set forth above and with other features and alternatives.

BRIEF DESCRIPTION OF THE DRAWINGS

The present invention will be readily understood by the following detailed description in conjunction with the accompanying drawings. To facilitate this description, like reference numerals designate like structural elements.

FIG. 3 is a circuit diagram of a unit amplifier of a second embodiment of a variable gain amplifier according to the invention;

FIG. 4 is a circuit diagram showing a configuration of a conventional polar loop transmitter;

FIG. 10 is a chart showing a design example of a level diagram of the variable gain amplifier for output power control for use in carrying out the fourth embodiment.

DESCRIPTION OF THE PREFERRED EMBODIMENTS

An invention for a variable gain amplifier of low amplitude distortion, and low noise, having a large variable range is disclosed. Numerous specific details are set forth in order to provide a thorough understanding of the present invention. It will be understood, however, to one skilled in the art, that the present invention may be practiced without some or without all of these specific details.

Figure 1A:
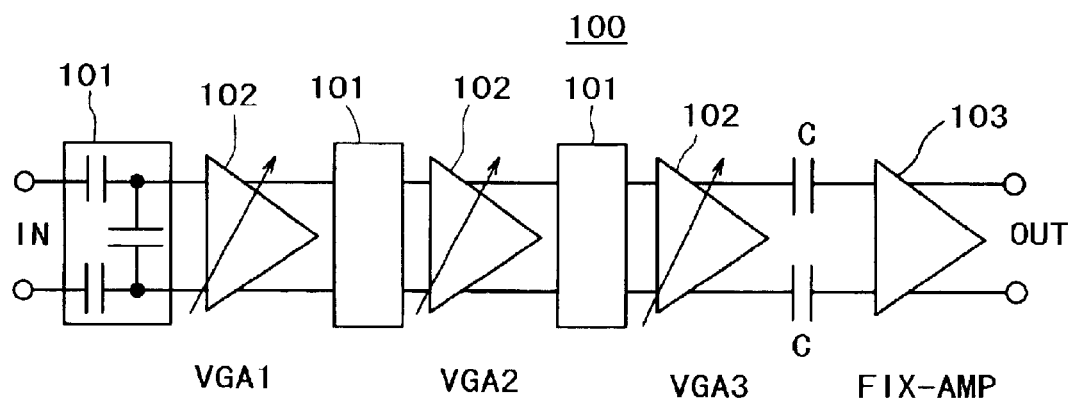
FIG. 1A is a block circuit diagram of a first embodiment of a variable gain amplifier according to the invention.
Figure 1B:
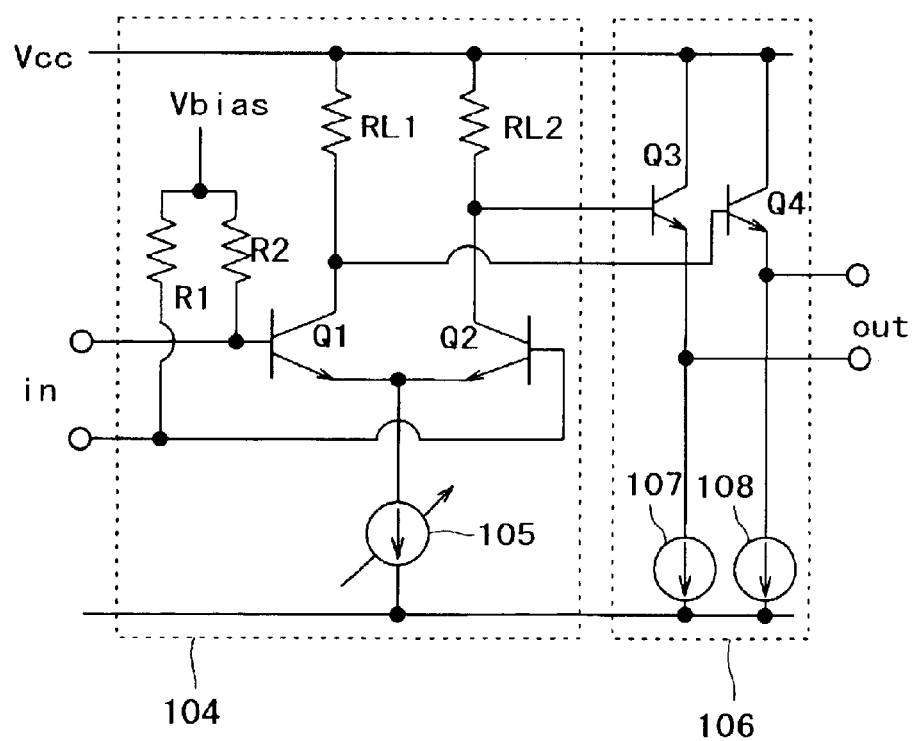
FIG. 1B a circuit diagram of a unit amplifier of the variable gain amplifier.
Figure 2A:
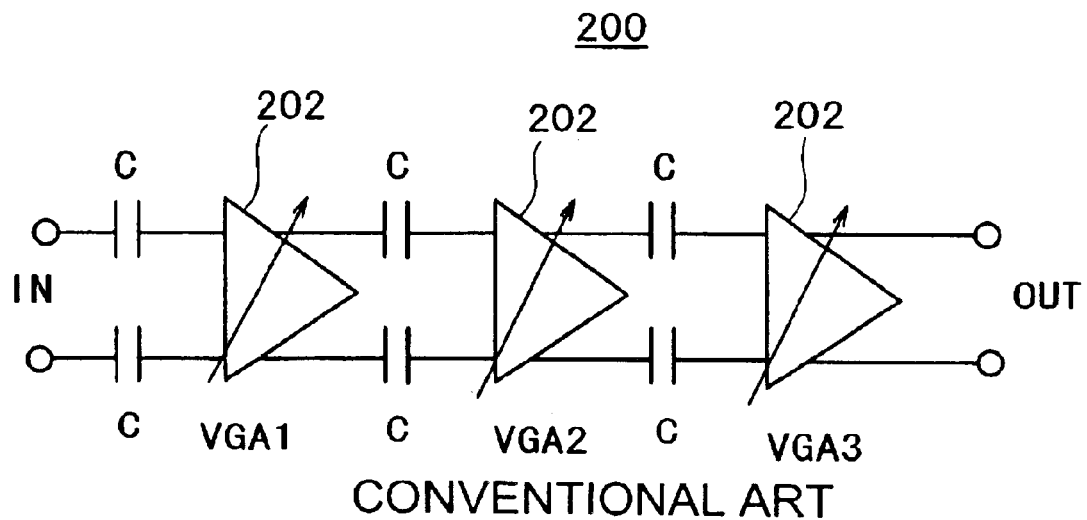
FIG. 2A is a block circuit diagram of a conventional variable gain amplifier.
Figure 2B:
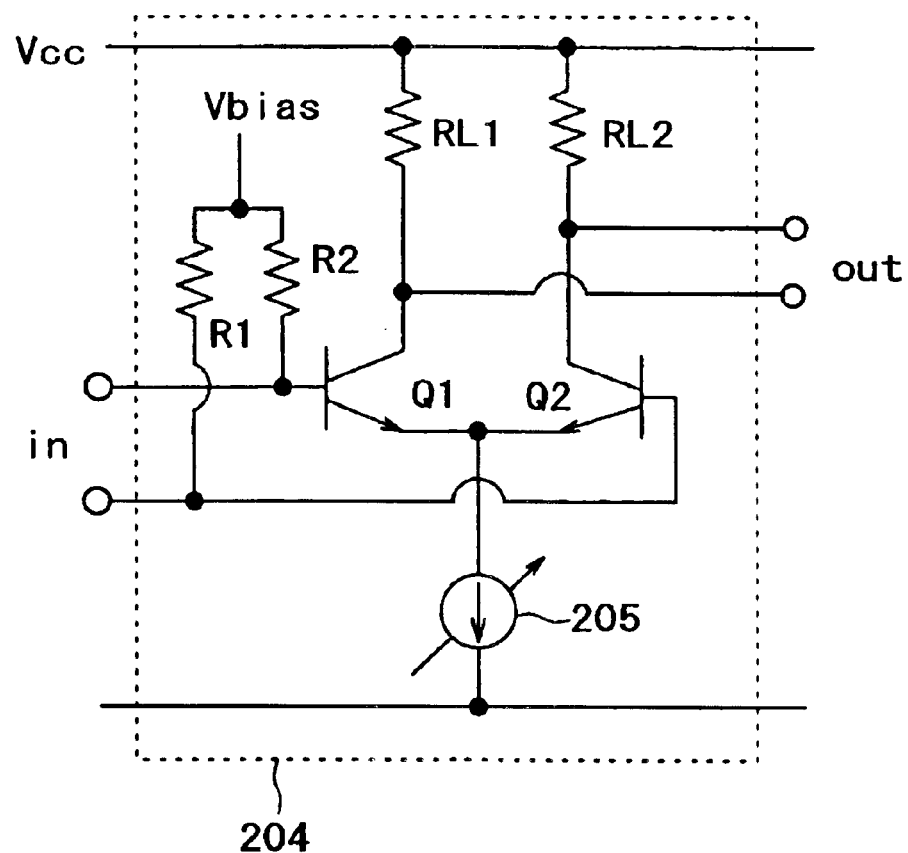
FIG. 2B a circuit diagram of a unit amplifier of the conventional variable gain amplifier.

FIG. 1 shows a first embodiment of a variable gain amplifier 100 according to the invention. FIG. 1(A) is a block circuit diagram of the variable gain amplifier 100 according to the first embodiment, and FIG. 1(B) a circuit diagram of a unit amplifier 102. As shown in FIG. 1(A), the present embodiment is similar to the conventional example in that the unit amplifiers (VGA) 102 are series connected in 3 stages from VGA1 to VGA3, however, differs in block configuration from the conventional example in that an attenuator 101 utilizing voltage division by capacitors, doubling as a device for DC cut is installed on the input side of the respective VGAs, and a fixed gain amplifier (FIX-AMP) 103 is installed in the final stage of the variable gain amplifier. For the fixed gain amplifier 103, use can be made of, for example, a common emitter amplifier.

Further, as to a circuit configuration of the respective VGAs, a variable gain differential amplifier 104 similar in configuration to that of the conventional example is employed as shown in FIG. 1(B). However, the respective, VGAs differ from the unit amplifier of the conventional example in that an emitter follower 106 for driving a back-end stage, comprising transistors Q3, Q4, and current sources 107, 108, is installed on the output side of the variable gain differential amplifier. In general, an emitter follower is excellent in frequency characteristic and distortion characteristic, having such characteristics as high input impedance and low output impedance, so that the emitter follower is suitable for driving the back-end stage circuit.

The variable gain differential amplifier 104 executes control of a gain by utilizing a change in gain of a differential pair transistors consisting of transistors Q1, Q2, taking place in proportion to bias current supplied by a variable current source 105.

By adopting a configuration such that the attenuator 101 is installed on the respective input sides of VGA1–VGA3, making up the variable gain amplifier 100, thereby attenuating signals entering the respective VGAs, amplitude distortion is prevented from occurring to the respective VGAs. In this case, the reason for use of the attenuator 101 utilizing voltage division by capacitors as an attenuator is to lower noises because the attenuator 101 utilizing voltage division by capacitors generates no noise. In contrast, an attenuator using resistance generates noises, and consequently, is not suitable for the purpose of RF low noise. Further, use of a variable attenuator that electrically performs variable control corresponding to an input instead of a fixed attenuator has been considered, but such an idea has turned out impractical because the variable attenuator requires a multitude of circuit elements such as a resistor, transistor, diode, current source, etc., rendering the configuration thereof complex, and in addition, it has been difficult to meet requirements for RF low noise characteristics.

Furthermore, in the case of using the variable attenuator for a variable gain amplifier for output power control of a polar loop transmitter according to third and fourth embodiments, respectively, to be described later, it becomes still more difficult to control both noise and a gain, so that use of the fixed attenuator for the attenuator 101 of a fixed amount of attenuation type, utilizing voltage division by capacitors, is after all optimal. Another suitable fixed attenuator for low noise in RF region, if any, may alternatively be used.

The reason for installing the fixed gain amplifier 103 in the last stage is to obtain a total gain as desired. A variable gain differential amplifier requires large current consumption. Advantageously, the variable gain amplifier 100 with the fixed gain amplifier 103 in the final stage consumes less power than a variable gain amplifier with a variable gain differential amplifier in every stage.

As described above, with the configuration of the present embodiment, shown in FIG. 1, a variable gain amplifier having a large variable range and low amplitude distortion can be provided.

With the present embodiment, there is shown a case where the attenuator 101 is installed on the respective input sides of all the VGAs 102. However, since the effect of noise is the largest in the initial stage, even if the attenuator 101 is installed only in the initial stage, an advantageous effect of low noise can be obtained. Accordingly, the attenuator 101 may be installed on the input side of either the initial stage or the back-end stage. Further, it will be more advantageous from the viewpoint of low noise even if the total gain is the same to install the attenuator on the input side of the VGA in the respective stages because noise generated in a preceding stage is attenuated by the attenuator disposed between the stages.

With the present embodiment, the configuration of the variable gain amplifier, based on bipolar transistors, has been described. It is described herein that a variable gain amplifier can be similarly made up on the basis of MOS field effect transistors (Metal-Oxide-Semiconductor Field Effect Transistors, hereinafter referred to merely as MOS transistors).

Figure 11:
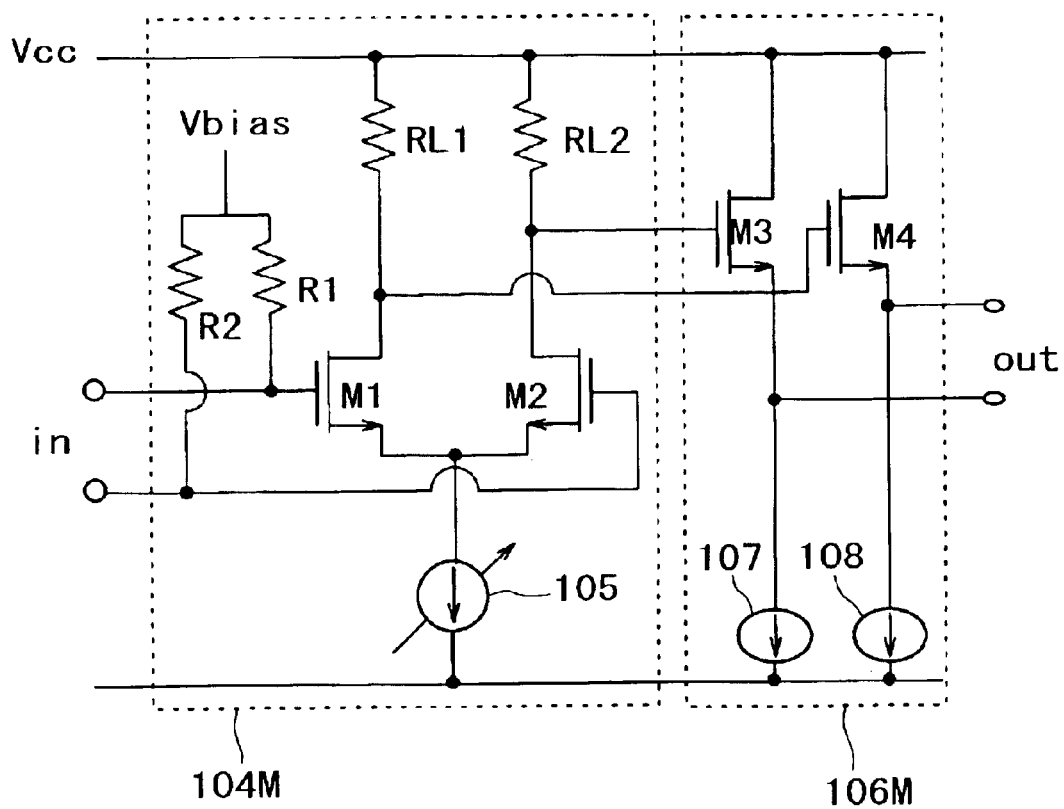
FIG. 11 is a circuit diagram in the case where the variable gain differential amplifier shown in FIG. 1B and an amplifier installed at the output part thereof are made up of MOS transistors.

FIG. 11 is a circuit diagram of a VGA wherein the variable gain differential amplifier and an amplifier installed at the output part of the variable gain differential amplifier, as shown in FIG. 1B, are made up of MOS transistors.

Since gain of a MOS transistor is proportional to the square root of a bias current strength, a variable gain differential amplifier controlling a gain with bias current can be implemented by use of the MOS transistors. As shown in FIG. 11, a variable gain differential amplifier 104M is made up by substituting MOS transistors M1, M2, with respective sources thereof connected with each other, for the transistors Q1, Q2, of the variable gain differential amplifier 104 shown in FIG. 1, with the respective emitters thereof connected with each other. As with the variable gain differential amplifier 104 made up of the bipolar transistors, a gain of the variable gain differential amplifier 104M made up of the MOS transistors is controlled by controlling a current value of a variable current source 105.

Further, a source follower 106M installed at the output part of the respective VGAs, for driving a back-end stage circuit, can be made up by substituting MOS transistors M3, M4, for the transistors Q3, Q4, of the emitter follower 106 shown in FIG. 1. The fixed gain amplifier 103 installed in the final stage can be made of MOS transistors although not shown in the figure. For example, a common-source amplifier may be used.

Even in the case of making up the variable gain amplifier shown in FIG. 1(A) with the use of VGA1 to VGA3, made of MOS transistors, an attenuator utilizing voltage division by capacitors, installed at the input part of the respective VGAs, and a fixed gain amplifier made of MOS transistors, it is possible to provide a variable gain amplifier having a large variable range and low amplitude distortion as with the case of making up the variable gain amplifier with the use of the bipolar transistors.

FIG. 3 is a circuit diagram of a unit amplifier of a second embodiment of a variable gain amplifier according to the invention. The block circuit diagram of the variable gain amplifier according to the second embodiment is the same in configuration as that of the first embodiment, shown in FIG. 1(A), and the present embodiment differs from the first embodiment only in respect of the configuration of the unit amplifier (VGA).

That is, the present embodiment has a block configuration similar to that of the first embodiment wherein an attenuator 101 utilizing voltage division by capacitors is installed on the input side of the respective unit amplifiers 102, and a fixed gain amplifier 103 is installed in the final stage of the variable gain amplifier, however, differs from the first embodiment in respect of a circuit configuration of the respective unit amplifiers 102 in that use is made of a unit amplifier comprising a variable gain differential amplifier 304, a current mirror circuit 307 for controlling a gain of the variable gain differential amplifier 304, and an emitter follower 106 for driving a succeeding stage, as shown in FIG. 3. For easy comparison, the present embodiment will be described on the assumption that VGA1 to VGA3 are series connected in 3 stages.

As with the first embodiment, the emitter follower 106 for driving a succeeding stage circuit is installed on the outlet side of the respective VGAs, and a fixed gain amplifier 103 is installed in the final stage of the variable gain amplifier in order to obtain a total gain as desired.

The variable gain differential amplifier 304 according to the present embodiment has a circuit configuration such that a single amplifier made of a transistor Q1 and another single amplifier made of a transistor Q2 are placed side by side for differentiation, and diodes D1, D2 are inserted in respective emitters of the transistor Q1, Q2, respectively. A gain of the variable gain differential amplifier 304 is controlled by control of current via the current mirror circuit 307 comprising a variable current source 308, resistor R3, transistor Q5, and diode D3.

The diodes D1, D2 inserted in the respective emitters of the variable gain differential amplifier 304 have effect of improving circuit linearity, respectively. More specifically, with the diodes D1, D2 inserted in the respective emitters, a signal transmitted between the base and the emitter of the transistors Q1, Q2, respectively, has its amplitude halved, thereby becoming less prone to amplitude distortion. Accordingly, circuit linearity is improved.

By use of the variable gain differential amplifier 304 for the unit amplifier 102 of the variable gain-amplifier 100, an amount of attenuation of the unit amplifier VGA1 in the initial stage, required for prevention of occurrence of amplitude distortion, can be reduced in comparison with that in the case of using the variable gain differential amplifier 104 shown in FIG. 1(B). Consequently, a gain of the fixed gain amplifier 103 in the final stage, required for obtaining a total gain as desired, can be reduced. Since noise generated in a preceding stage of a multi-stage amplifier is amplified in later stages, the output noise of the variable gain amplifier 100 can be reduced further by reducing the gain in the final stage in this way.

For the diodes D1, D2, use may be made of either a bipolar transistor of diode connection, interconnecting the collector and the base, or a diffusion diode may be used.

Accordingly, the present embodiment can provide a variable gain amplifier having a large variable range and low amplitude distortion, generating noise lower than that for the first embodiment.

A third embodiment of the invention, using the variable gain amplifier according to the invention, is described hereinafter. With the third embodiment, the variable gain amplifier according to the first embodiment, as shown in FIG. 1, is used as a variable gain amplifier for output power control of a polar loop transmitter.

A polar loop method is a linearization method for a power amplifier (PA) applicable to a transmitter handling signals having information in its amplitude and phase. FIG. 4 shows a configuration of a conventional polar loop transmitter. The polar loop transmitter is made up of a phase loop using a phase comparator 413 and an amplitude loop using an amplitude comparator 410. A thick line shown in FIG. 4 indicates the amplitude loop.

An output signal from an IQ modulator 409, receiving signals I, Q, having a phase difference of 90° therebetween, and an output of an intermediate frequency voltage control oscillator (IFVCO) 408, and outputting modulated signals in the intermediate frequency (IF) band, is inputted to respective positive phase input terminals of the amplitude comparator 410 and the phase comparator 413. Meanwhile, a feedback signal detecting an output of a power amplifier (PA) 401 via a coupler 402 passes through an attenuator 403 and undergoes frequency conversion into the IF band by the agency of an oscillation signal of an RF local oscillator 405 and a down-convert mixer 404 before being inputted to respective inverse phase input terminals of the amplitude comparator 410 and the phase comparator 413. The phase comparator 413 compares respective phases of both the signals with each other, thereby applying feedback to a control terminal of a transmission voltage control oscillator (TXVCO) 415 so as to equalize the phases of both the signals. As a result, frequency conversion from the IF band to the RF band can be executed while a transmission signal can be phase-modulated.

Meanwhile, the amplitude comparator 410 compares the respective amplitudes of both the signals with each other, thereby applying feedback to a control terminal of the power amplifier (PA) 401 so as to equalize the amplitudes of both the signals. As a result, the transmission signal as phase-modulated, outputted from the transmission voltage control oscillator (TxVCO) 415, can be amplitude-modulated into an RF signal of a given amplitude.

Thus, the polar loop transmitter can transmit signals having information in the directions of amplitude and phase, respectively, from an antenna (ANT) without being distorted. A loop filter 411 is a low-pass filter for converting an output of the amplitude comparator 410 into a signal for the control of the power amplifier (PA) 401 while a loop filter 414 is a low-pass filter for converting an output of the phase comparator 413 into a signal for the control of the transmission voltage control oscillator (TxVCO) 415.

The polar loop transmitter as above is described in further detail in, example, the non-patent document 2.

The amplitude loop operates such that the amplitude of the signal from the IQ modulator 409 becomes equal to that of the feedback signal from the down-convert mixer 404.

Figure 5:
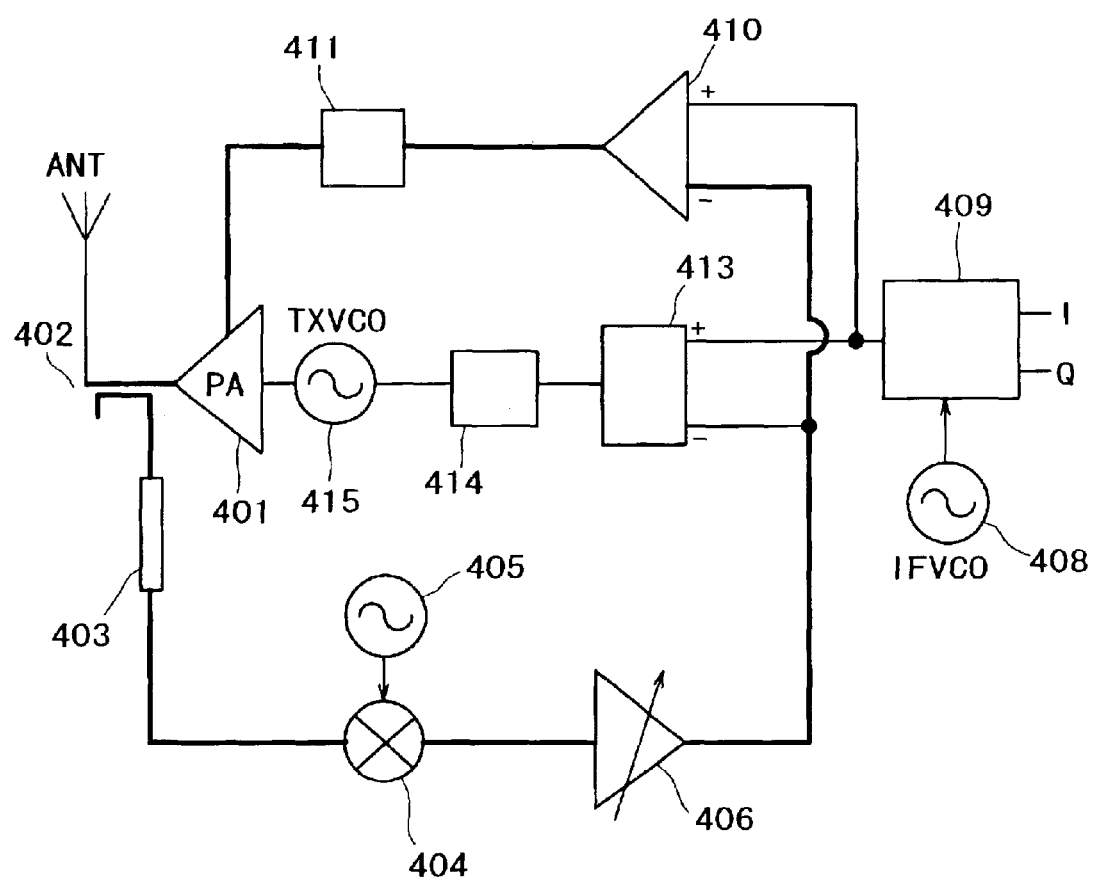
FIG. 5 is a view of a third embodiment of the invention, using the variable gain amplifier according to the invention, showing a block circuit diagram of a polar loop transmitter having a function for output power control.
Figure 6:
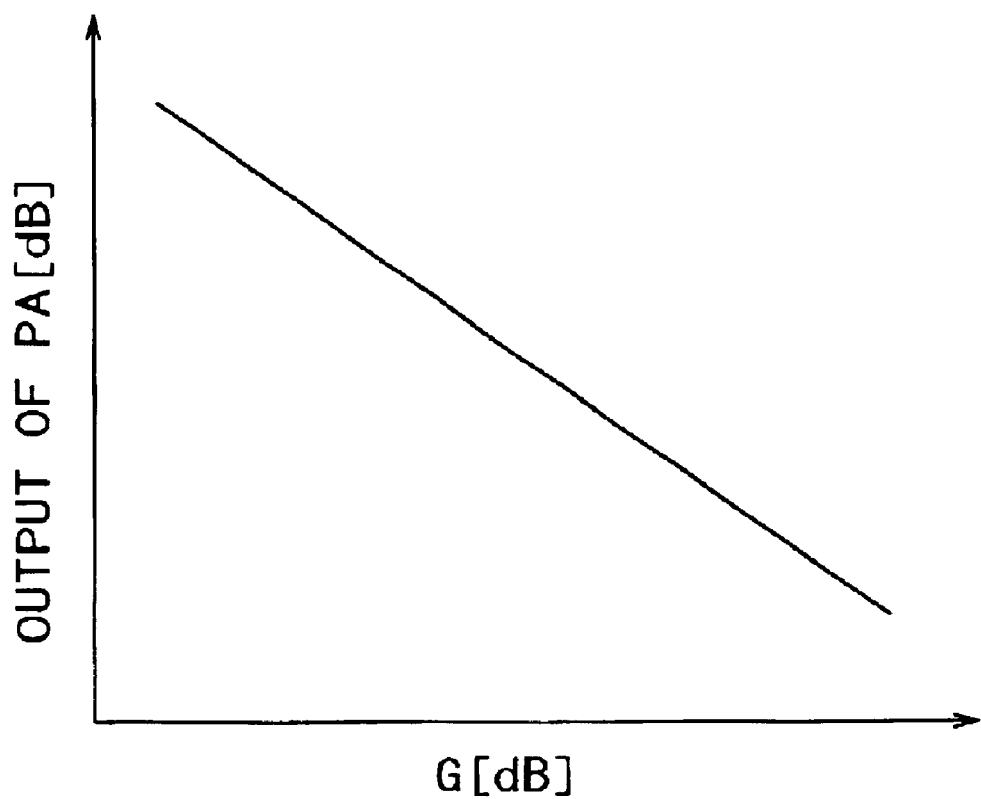
FIG. 6 is a graph showing a relationship between the gain of the variable gain amplifier for output power control, used in a circuit configuration in FIG. 5, and the output level of a power amplifier.

With the present embodiment, therefore, a variable gain amplifier 406 for output power control is installed in a feedback path of the amplitude loop, as shown in FIG. 5, with the aim of controlling an output level of the power amplifier (PA) 401 by controlling the gain of the variable gain amplifier 406. That is, this will enable the output power of the polar loop transmitter to be controlled. Herein, a relationship between a gain G of the variable gain amplifier 406 and an output level of the power amplifier (PA) 401 is shown in FIG. 6. It can be said from FIG. 6 that the relationship should be such that if the output of the power amplifier (PA) 401 (hereinafter referred to as PA output) is larger, the gain G of the variable gain amplifier 406 is smaller while if the PA output is smaller, the gain G of the variable gain amplifier 406 is larger.

Accordingly, in the case of controlling the output power of the polar loop transmitter, the following characteristics are required of the variable gain amplifier 406.

A large variable range is required for implementing control of the output power.

High linearity is required for distortionless transmission of signals having information in the direction of amplitude.

It is necessary to receive large signals from the power amplifier at times of a low gain. Accordingly, particularly high linearity is required at the times of the low gain.

In applications for portable terminals, the specification concerning noise in the Rx band is severe, so that a low noise characteristic is required of the variable gain amplifier.

Now, assuming a case by way of example where the linearity of the variable gain amplifier 406 is specified to be 0.1 dB-ICP (Input Compression Point) according to the specification, a specific design thereof is described hereinafter. Herein, 0.1 dB-ICP refers to an input signal level which gain varies by 0.1 dB when an input signal level of an amplifier is raised due to non-linearity of a circuit.

The variable gain amplifier 100 shown in FIG. 1 is used as the variable gain amplifier 406. It is theoretically known that an input distortion characteristic of the variable gain differential amplifier 104 for use in the respective unit amplifiers 102 making up the variable gain amplifier 100 does not undergo change in spite of a change in gain by changing bias current, and ICP is not dependent on the gain.

Figure 7:
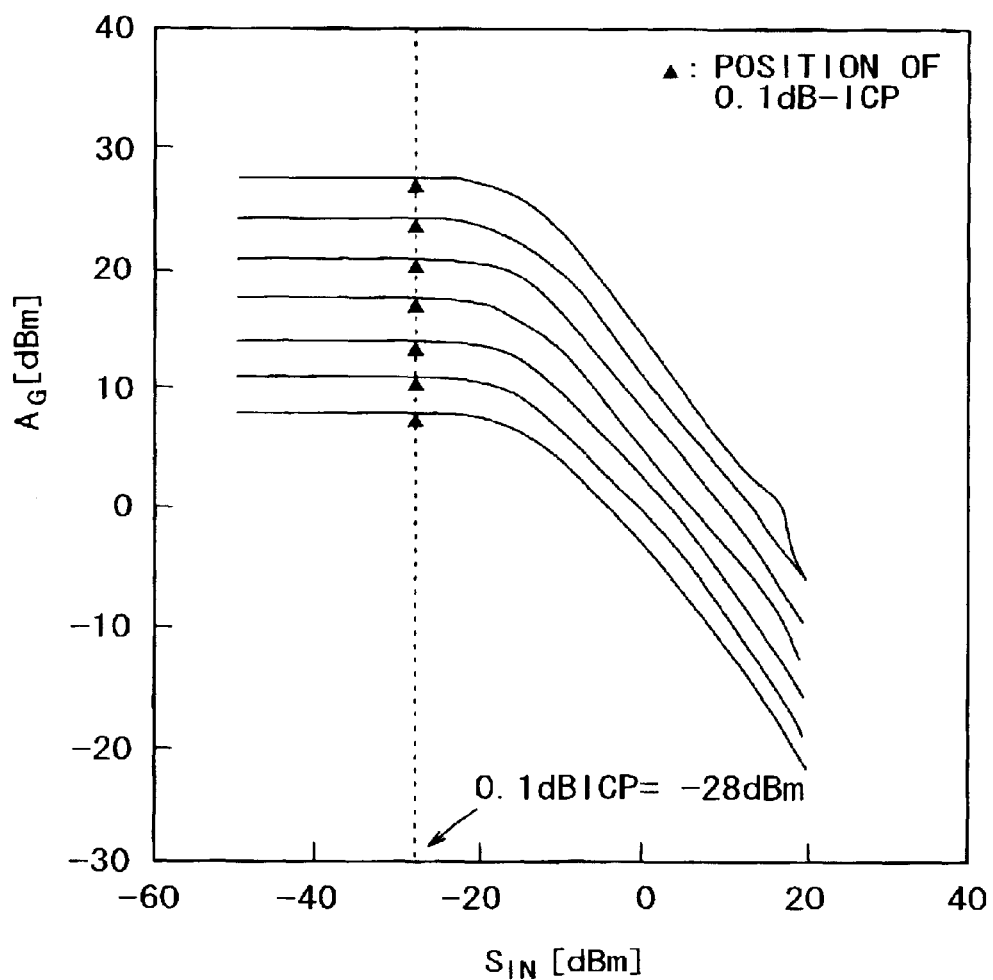
FIG. 7 is a characteristics diagram showing simulation results indicating dependence of the gain of the variable gain differential amplifier, shown in FIG. 1, on an input signal level ($S_{IN}$)

FIG. 7 shows simulation results indicating dependence of a gain $A_G$ of the variable gain differential amplifier 104 on an input signal level $S_{IN}$. In the figure, there is shown the characteristic of the variable gain differential amplifier 104 in the case where the gain is set to various values by changing control current (current from the variable current source 105). In FIG. 7, black triangle signs indicate positions of the 0.1 dB-ICP of the variable gain differential amplifier 104. The 0.1 dB-ICP of the variable gain differential amplifier 104 remains at −28 dBm, proving that the 0.1 dB-ICP does not change much even if the gain is varied.

Figure 8:
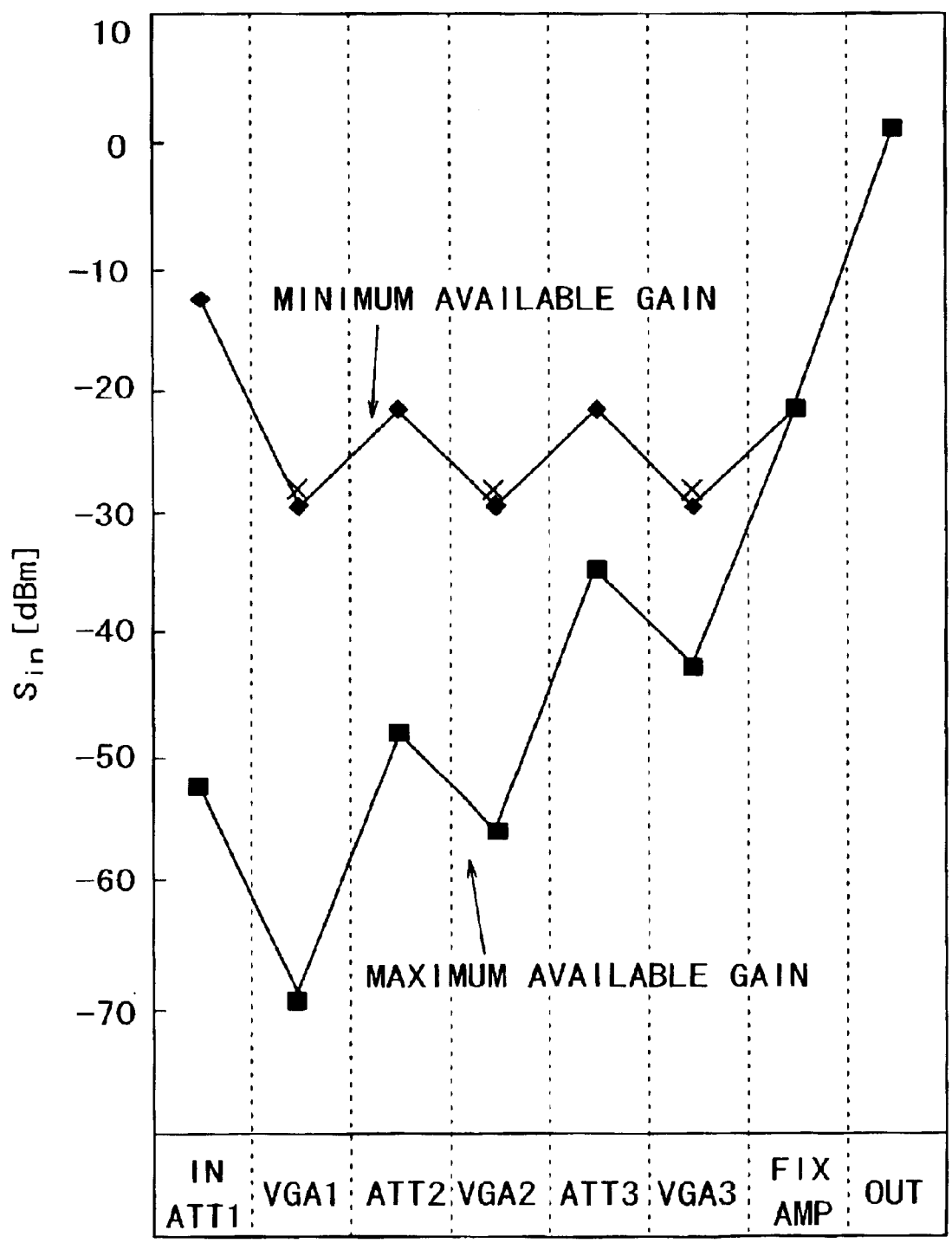
FIG. 8 is a chart showing a design example of a level diagram of the variable gain amplifier for output power control for use in carrying out the third embodiment.

FIG. 8 is view showing a design example of a level diagram of the variable gain amplifier 100 in whole, from input IN to output OUT. As shown in FIG. 1, the variable gain amplifier 100 is provided with the attenuator 101 utilizing voltage division by capacitors on the respective input sides of the VGA1 to VGA3. In FIG. 8, respective blocks of the attenuators 101 are denoted by ATT1 to ATT3 sequentially from the VGA1 side.

The level diagram in FIG. 8 indicates the input signal level $S_{IN}$ of the respective blocks. In the figure, there are shown the level diagrams for the polar loop transmitter, shown in FIG. 5, at the time of the minimum available gain when the PA output is the largest, and at the time of the maximum available gain when the PA output is the smallest, respectively. As previously described, the ICP of the variable gain differential amplifier 104 does not undergo deterioration even if the gain is increased. Further, in view of the relationship shown in FIG. 6, it can be said that, in the case of output power control, an increase in the gain of the variable gain amplifier 406 will result in a decrease in the input signal level to the extent of the increase. Accordingly, if distribution of gain is decided upon such that amplitude distortion will not occur at the time of the minimum available gain, an increase in the gain will not result in occurrence of amplitude distortion provided that the amplitude loop operates normally.

Hence, at the time of the minimum available gain when a large signal from the power amplifier (PA) 401 is received, an amount of attenuation of the attenuator ATT1 in the initial stage is set such that the input signal level of the VGA1 in the initial stage becomes less than the 0.1 dB-ICP (gain at a position indicated by a sign X in FIG. 8) of the VGA1 in the initial stage.

With the respective VGAs in succeeding stages as well, respective amounts of attenuation of the attenuators ATT2, ATT3 are decided upon such that the input signal level of the respective VGAs becomes less than the 0.1 dB-ICP of the respective VGAs at the time of the minimum available gain. Then, a total gain as desired is obtained with the fixed gain amplifier (FIX-AMP) 103 installed in the final stage. With a multi-stage amplifier, since noise generated in a preceding stage is amplified in later stages, it is effective for lowering noise to reduce the gain in the final stage. Hence, the amount of attenuation of the respective attenuators is decided upon such that the input signal level $S_{IN}$ of the respective VGAs becomes slightly less than the 0.1 dB-ICP (gain at respective positions indicated by a sign X in FIG. 8) of the respective VGAs, designing such that a gain in respective later stages is rendered as small as possible.

Thus, with the present embodiment, it is possible to provide the polar loop transmitter with an excellent function for output power control without causing significant deterioration of the distortion characteristic thereof.

A fourth embodiment of the invention, using the variable gain amplifier according to the invention, is described hereinafter. With the fourth embodiment, the variable gain amplifier according to the second embodiment, as shown in FIG. 3, is used as a variable gain amplifier for output power control of a polar loop transmitter of the configuration shown in FIG. 5.

As with the case of the third embodiment, assuming a case by way of example where the linearity of the variable gain amplifier 406 is specified to be 0.1 dB-ICP, a specific design thereof is described hereinafter. It is theoretically known that the input distortion characteristic of the variable gain differential amplifier 304 shown in FIG. 3 for use in the respective unit amplifiers VGA1 to VGA3, making up the variable gain amplifier, does not undergo change in spite of a change in gain by changing bias current, and ICP is not dependent on the gain.

Figure 9:
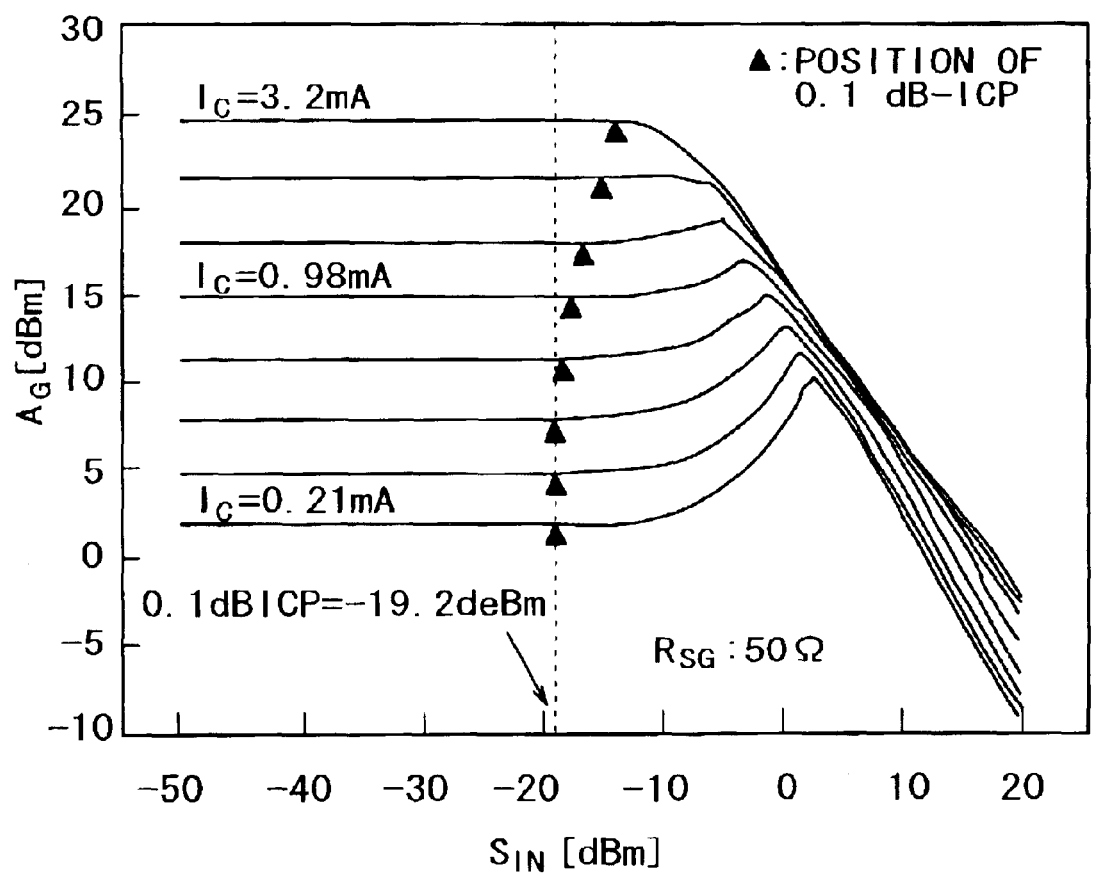
FIG. 9 is a characteristics diagram showing simulation results indicating dependence of the gain of the variable gain differential amplifier, shown in FIG. 3, on an input signal level ($S_{IN}$)

FIG. 9 shows simulation results indicating dependence of the gain $A_G$ of the variable gain differential amplifier 304 on an input signal level $S_{IN}$. In FIG. 9, there is shown the characteristic of the variable gain differential amplifier 304 in the case where the gain is set to various values by changing control current (current Ic supplied from the variable current source 308 of the current mirror 307 to the collector of the transistor Q5). In this case, a signal source resistance is assumed to be 50 Ω. In FIG. 9, black triangle signs indicate positions of 0.1 dB-ICP of the variable gain differential amplifier 304. In a state where the current Ic is large in value and a gain is high, distortion on the input side cancels out distortion on the output side and vice versa, so that the 0.1 dB-ICP is at a somewhat high value, however, when the gain is lowered, the 0.1 dB-ICP gradually approaches a given value (−19.2 dBm)

FIG. 10 is a view showing a design example of a level diagram of the variable gain amplifier in whole. The level diagram indicates the input signal level $S_{IN}$ of respective blocks. In the figure, there are shown the level diagrams at the time of the minimum available gain when the PA output is the largest, and at the time of the maximum available gain when the PA output is the smallest, respectively. As previously described, the ICP of the variable gain differential amplifier 304 does not undergo deterioration even if the gain is increased. Further, in view of the relationship shown in FIG. 6, it can be said that when controlling the output power of the polar loop transmitter, an increase in the gain of the variable gain amplifier 406 will result in a decrease in the input signal level to the extent of the increase. Hence, as with the third embodiment previously described, if distribution of gain is decided upon such that amplitude distortion will not occur at the time of the minimum available gain, an increase in the gain will not result in occurrence of amplitude distortion provided that the amplitude loop operates normally.

Accordingly, at the time of the minimum available gain when a large signal from the power amplifier (PA) 401 is received, an amount of attenuation of the attenuator ATT1 in the initial stage is set such that the input signal level of the VGA1 in the initial stage becomes less than the 0.1 dB-ICP (gain at a position indicated by a sign X in FIG. 10) of the VGA1 in the initial stage.

With the VGAs in succeeding stages as well, respective amounts of attenuation of the attenuators ATT2, ATT3 on the input side of the respective VGAs are decided upon such that the input signal level of the respective VGAs becomes less than the 0.1 dB-ICP (gain at respective positions indicated by a sign X in FIG. 10) of the respective VGAs at the time of the minimum available gain. Then, a total gain as desired is obtained with the fixed gain amplifier (FIX-AMP) installed in the final stage. With a multi-stage amplifier, since noise generated in a preceding stage is amplified in later stages, it is effective for lowering noise to reduce a gain in the final stage. Accordingly, an amount of attenuation of the respective attenuators is decided upon such that the input signal level SIN of the respective VGAs becomes slightly less than the 0.1 dB-ICP of the respective VGAs, designing such that the a gain in respective later stages is rendered as small as possible.

The 0.1 dB-ICP of the variable gain differential amplifier 304 is higher by about 9 dB in comparison with that of the variable gain differential amplifier 104, and consequently, the amount of the attenuation of the attenuator ATT1 in the initial stage of the variable gain amplifier 406 can be rendered smaller by about 9 dB. Hence, it is possible to reduce the gain in the final stage, necessary for obtaining the total gain as desired, so that with the present embodiment can achieve a low noise characteristic better than that for the third embodiment employing the variable gain differential amplifier 104.

Thus, with the present embodiment as well, it is possible to provide the polar loop transmitter with an excellent function for output power control without causing significant deterioration of the distortion characteristic and noise characteristic thereof.

While the preferred embodiments of the invention have been described as above, the scope of the invention is not limited to such configuration as described in those preferred embodiments, and it is evident that changes and variations in design may be made without departing from the spirit or scope of the invention.

The invention can provide the variable gain amplifier of low amplitude distortion, and low noise, having a large variable range. Hence, the invention can provide a linear transmitter such as the polar loop transmitter, having a negative feedback loop for amplitude components with an excellent function for output power control.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A variable gain amplifier having a multiple-stage configuration, the variable gain amplifier comprising:
    a plurality of variable gain unit amplifiers connected in series, wherein the plurality of variable gain unit amplifiers are configured to obtain a large variable gain range for the variable gain amplifier, wherein each of the plurality variable gain unit amplifiers has a differential input side; and
    a plurality of low noise attenuators, wherein a corresponding one of the plurality of low noise attenuators is respectively connected to the differential input side of each of the plurality of variable gain unit amplifiers.

2. The variable gain amplifier of claim 1, wherein at least one of the plurality of low noise attenuators is configured to perform voltage division via capacitors, wherein the at least one of the plurality of low noise attenuators comprises:
    a first capacitor;
    a second capacitor; and
    a third capacitor, wherein differential input terminals are connected to a first terminal of the first capacitor and to a first terminal of the second capacitor, wherein the third capacitor is connected between a second terminal of the first capacitor and a second terminal of the second capacitor, wherein differential output terminals are connected to the second terminal of the first capacitor and to the second terminal of the second capacitor.

3. The variable gain amplifier of claim 1, further comprising a final stage having a fixed gain amplifier.

4. The variable gain amplifier of claim 2, further comprising a final stage having a fixed gain amplifier.

5. The variable gain amplifier of claim 1, wherein at least one of the plurality of variable gain unit amplifiers includes a variable gain differential amplifier.

6. The variable gain amplifier of claim 2, wherein at least one of the plurality of variable gain unit amplifiers includes a variable gain differential amplifier.

7. The variable gain amplifier of claim 3, wherein at least one of the plurality of variable gain unit amplifiers includes a variable gain differential amplifier.

8. The variable gain amplifier of claim 4, wherein at least one of the plurality of variable gain unit amplifiers includes a variable gain differential amplifier.

9. The variable gain amplifier of claim 5, wherein the variable gain differential amplifier comprises:
  a first transistor;
  a second transistor;
  a first load resistor connected between a collector of the first transistor and a power source;
  a second load resistor connected between a collector of the second transistor and the power source, wherein an emitter of the first transistor is bonded to an emitter of the second transistor to form bonded emitters;
  a variable current source connected between the bonded emitters and a ground;
  differential input terminals connected to a base of the first transistor and to a base of the second transistor; and
  differential output terminals connected to the collector of the first transistor and to the collector of the second transistor.

10. The variable gain amplifier of claim 6, wherein the variable gain differential amplifier comprises:
  a first transistor;
  a second transistor;
  a first load resistor connected between a collector of the first transistor and a power source;
  a second load resistor connected between a collector of the second transistor and the power source, wherein an emitter of the first transistor is bonded to an emitter of the second transistor to form bonded emitters;
  a variable current source connected between the bonded emitters and a ground;
  differential input terminals connected to a base of the first transistor and to a base of the second transistor; and
  differential output terminals connected to the collector of the first transistor and to the collector of the second transistor.

11. The variable gain amplifier of claim 7, wherein the variable gain differential amplifier comprises:
  a first transistor;
  a second transistor;
  a first load resistor connected between a collector of the first transistor and a power source;
  a second load resistor connected between a collector of the second transistor and the power source, wherein an emitter of the first transistor is bonded to an emitter of the second transistor to form bonded emitters;
  a variable current source connected between the bonded emitters and a ground;
  differential input terminals connected to a base of the first transistor and to a base of the second transistor; and
  differential output terminals connected to the collector of the first transistor and to the collector of the second transistor.

12. The variable gain amplifier of claim 8, wherein the variable gain differential amplifier comprises:
  a first transistor;
  a second transistor;
  a first load resistor connected between a collector of the first transistor and a power source;
  a second load resistor connected between a collector of the second transistor and the power source, wherein an emitter of the first transistor is bonded to an emitter of the second transistor to form bonded emitters;
  a variable current source connected between the bonded emitters and a ground;
  differential input terminals connected to a base of the first transistor and to a base of the second transistor; and
  differential output terminals connected to the collector of the first transistor and to the collector of the second transistor.

13. The variable gain amplifier of claim 5, wherein the variable gain differential amplifier comprises:
  a first transistor;
  a second transistor;
  a first load resistor connected between a collector of the first transistor and a power source;
  a second load resistor connected between a collector of the second transistor and the power source;
  a first diode connected between an emitter of the first transistor and a ground;
  a second diode connected between an emitter of the second transistor and the ground;
  differential input terminals connected to a base of the first transistor and to a base of the second transistor; and
  differential output terminals connected to the collector of the first transistor and to the collector of the second transistor.

14. The variable gain amplifier of claim 6, wherein the variable gain differential amplifier comprises:
  a first transistor;
  a second transistor;
  a first load resistor connected between a collector of the first transistor and a power source;
  a second load resistor connected between a collector of the second transistor and the power source;
  a first diode connected between an emitter of the first transistor and a ground;
  a second diode connected between an emitter of the second transistor and the ground;
  differential input terminals connected to a base of the first transistor and to a base of the second transistor; and
  differential output terminals connected to the collector of the first transistor and to the collector of the second transistor.

15. The variable gain amplifier of claim 7, wherein the variable gain differential amplifier comprises:
  a first transistor;
  a second transistor;
  a first load resistor connected between a collector of the first transistor and a power source;
  a second load resistor connected between a collector of the second transistor and the power source;

a first diode connected between an emitter of the first transistor and a ground; a second diode connected between an emitter of the second transistor and the ground;

differential input terminals connected to a base of the first transistor and to a base of the second transistor; and differential output terminals connected to the collector of the first transistor and to the collector of the second transistor.

16. The variable gain amplifier of claim 8, wherein the variable gain differential amplifier comprises:

a first transistor;

a second transistor;

a first load resistor connected between a collector of the first transistor and a power source;

a second load resistor connected between a collector of the second transistor and the power source;

a first diode connected between an emitter of the first transistor and a ground;

a second diode connected between an emitter of the second transistor and the ground;

differential input terminals connected to a base of the first transistor and to a base of the second transistor; and differential output terminals connected to the collector of the first transistor and to the collector of the second transistor.

17. A variable gain amplifier having a multiple-stage configuration, the variable gain amplifier comprising:

a plurality of variable gain unit amplifiers connected in series, wherein the plurality of variable gain unit amplifiers are configured to obtain a large variable gain range for the variable gain amplifier, wherein each of the plurality of variable gain unit amplifiers has a differential input side; and a plurality of low noise attenuators, wherein at least a first stage unit amplifier of the plurality of variable gain unit amplifiers is connected on the differential input side to a corresponding one of the plurality of low noise attenuators.

18. The variable gain amplifier of claim 17, wherein at least one of the plurality of variable gain unit amplifiers includes a variable gain different amplifier.

19. The variable gain amplifier of claim 18, wherein the variable gain differential amplifier comprises:

a first transistor;

a second transistor;

a first load resistor connected between a collector of the first transistor and a power source;

a second load resistor connected between a collector of the second transistor and the power source, wherein an emitter of the first transistor is bonded to an emitter of the second transistor to form bonded emitters, a variable current source connected between the bonded emitters and a ground;

differential input terminals connected to a base of the first transistor and to a base of the second transistor; and differential output terminals connected to the collector of the first transistor and to the collector of the second transistor.

20. The variable gain amplifier of claim 18, wherein the variable gain differential amplifier comprises:

a first transistor;

a second transistor;

a first load resistor connected between a collector of the first transistor and a power source;

a second load resistor connected between a collector of the second transistor and the power source;

a first diode connected between an emitter of the first transistor and a ground;

a second diode connected between an emitter of the second transistor and the ground;

differential input terminals connected to a base of the first transistor and to a base of the second transistor; and differential output terminals connected to the collector of the first transistor and to the collector of the second transistor.

21. A variable gain amplifier having a multiple-stage configuration, the variable gain amplifier comprising:

a plurality of variable gain unit amplifiers connected in series, wherein the plurality of variable gain unit amplifiers are configured to obtain a large variable gain range for the variable gain amplifier, wherein each of the plurality of variable gain unit amplifiers has a differential input side; and a plurality of low noise attenuators, wherein each of the plurality of variable gain unit amplifiers is respectively connected on the differential input side to a corresponding one of the plurality of low noise attenuators.

22. The variable gain amplifier of claim 21, wherein at least one of the plurality of variable gain unit amplifiers includes a variable gain differential amplifier.

23. The variable gain amplifier of claim 22, wherein the variable gain differential amplifier comprises:

a first transistor, a second transistor;

a first load resistor connected between a collector of the first transistor and a power source;

a second load resistor connected between a collector of the second transistor and the power source, wherein an emitter of the first transistor is bonded to an emitter of the second transistor to form bonded emitters;

a variable current source connected between the bonded emitters and a ground; differential input terminals connected to a base of the first transistor and to a base of the second transistor; and differential output terminals connected to the collector of the first transistor and to the collector of the second transistor.

24. The variable gain amplifier of claim 22, wherein the variable gain differential amplifier comprises:

a first transistor;

a second transistor;

a first load resistor connected between a collector of the first transistor and a power source;

a second load resistor connected between a collector of the second transistor and the power source;

a first diode connected between an emitter of the first transistor and a ground;

a second diode connected between an emitter of the second transistor and the ground;

differential input terminals connected to a base of the first transistor and to a base of the second transistor; and differential output terminals connected to the collector of the first transistor and to the collector of the second transistor.

* * * * *